United States Patent
Yamada et al.

(10) Patent No.: US 12,283,947 B2
(45) Date of Patent: Apr. 22, 2025

(54) SWITCHING DEVICE, ELECTRONIC APPLIANCE, AND VEHICLE

(71) Applicant: ROHM CO., LTD., Kyoto (JP)

(72) Inventors: Katsuaki Yamada, Kyoto (JP);
Shuntaro Takahashi, Kyoto (JP);
Muga Imamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 104 days.

(21) Appl. No.: 18/468,089

(22) Filed: Sep. 15, 2023

(65) Prior Publication Data

US 2024/0007103 A1 Jan. 4, 2024

Related U.S. Application Data

(63) Continuation of application No. PCT/JP2022/002347, filed on Jan. 24, 2022.

(30) Foreign Application Priority Data

Mar. 22, 2021 (JP) ................................. 2021-046862

(51) Int. Cl.
H03K 17/687 (2006.01)

(52) U.S. Cl.
CPC ................. H03K 17/687 (2013.01)

(58) Field of Classification Search
CPC .................................. H03K 17/687
USPC ....................................... 327/365
See application file for complete search history.

(56) References Cited

U.S. PATENT DOCUMENTS

| | | | |
|---|---|---|---|
| 2019/0123541 A1 | 4/2019 | Takuma et al. | |
| 2020/0312975 A1* | 10/2020 | Fukuda | G05F 1/463 |
| 2020/0403393 A1 | 12/2020 | Takuma et al. | |
| 2022/0037872 A1 | 2/2022 | Takuma et al. | |

(Continued)

FOREIGN PATENT DOCUMENTS

| | | |
|---|---|---|
| JP | S60-200618 | 10/1985 |
| JP | H05-503190 | 5/1993 |
| JP | H08-288817 | 11/1996 |

(Continued)

OTHER PUBLICATIONS

International Search Report and Written Opinion in International Appln. No. PCT/JP2022/002347, mailed on Apr. 19, 2022, 15 pages (with machine translation).

*Primary Examiner* — Tomi Skibinski
(74) *Attorney, Agent, or Firm* — Fish & Richardson P.C.

(57) ABSTRACT

A switching device includes: an N-type semiconductor substrate; a power MISFET having the N-type semiconductor substrate as its drain; an input electrode receiving an input signal; a control circuit generating a gate control signal for the power MISFET according to the input signal; and a negative current prevention circuit provided between the input electrode and the control circuit. The negative current prevention circuit includes: a P-channel MISFET connected, with its drain toward the input electrode and its source and back gate toward the control circuit, between the input electrode and the control circuit, with its gate fed with a fixed potential, with the potential at its back gate separated from the potential of the N-type semiconductor substrate; and a diode connected, with its anode toward the input electrode and its cathode toward the control circuit, between the input electrode and the control circuit.

10 Claims, 15 Drawing Sheets

(56) References Cited

U.S. PATENT DOCUMENTS

2023/0216289 A1    7/2023   Takuma et al.

FOREIGN PATENT DOCUMENTS

| JP | 2020-167338 | 10/2020 |
| WO | WO 2017/187785 | 11/2017 |

* cited by examiner

SWITCHING DEVICE, ELECTRONIC APPLIANCE, AND VEHICLE

CROSS-REFERENCE TO RELATED APPLICATIONS

This nonprovisional application is a continuation application of International Patent Application No. PCT/JP2022/002347 filed on Jan. 24, 2022, which claims priority Japanese Patent Application No. 2021-046862 filed on Mar. 22, 2021, the entire contents of which are hereby incorporated by reference.

TECHNICAL FIELD

The invention disclosed herein relates to switching devices, and to electronic appliances and vehicles that employ switching devices.

BACKGROUND ART

The present applicant has been developing many new technologies related to switching devices such as vehicle onboard IPDs (intelligent power devices) (see, for example, Patent Document 1 identified below).

CITATION LIST

Patent Literature

Patent Document 1: WO 2017/187785

DESCRIPTION OF EMBODIMENTS

<Semiconductor Device>

Various embodiments related to semiconductor devices will be described below with reference to the accompanying drawings.

Figure 1:
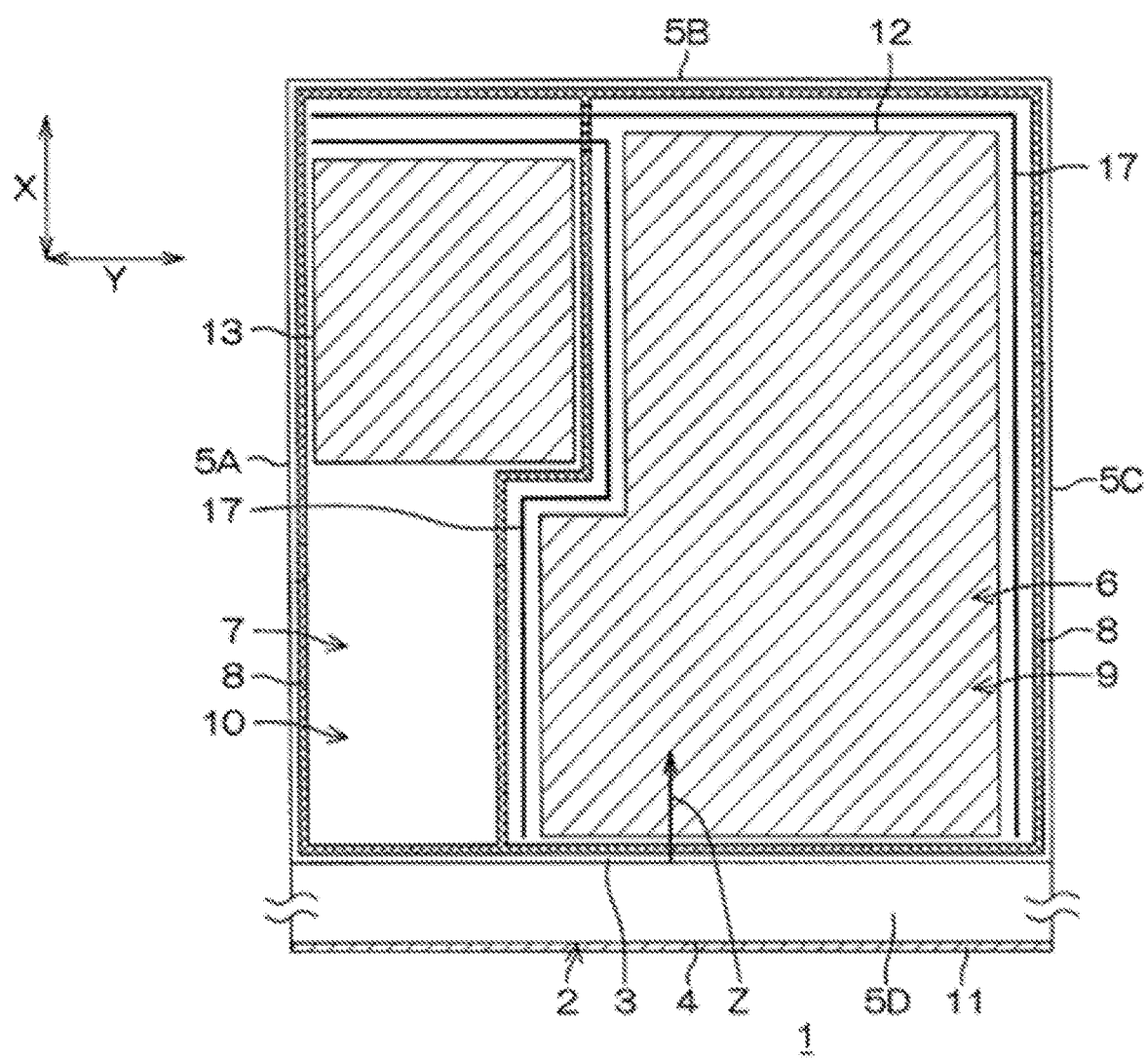
FIG. 1 is a perspective view of a semiconductor device as seen from one direction.

FIG. 1 is a perspective view of a semiconductor device 1 as seen from one direction. The following description deals with an illustrative embodiment where the semiconductor device 1 is a low-side switching device (what is called a low-side switching LSI).

Referring to FIG. 1, the semiconductor device 1 includes a semiconductor layer 2. The semiconductor layer 2 contains silicon. The semiconductor layer 2 is formed as a chip in the shape of a rectangular parallelepiped. The semiconductor layer 2 has a first principal face 3 at one side, a second principal face 4 at the opposite side, and side faces 5A, 5B, 5C, and 5D that connect between the first and second principal faces 3 and 4.

The first and second principal faces 3 and 4 are each formed in a rectangular shape as seen from the normal direction Z to it (hereinafter simply "as seen in a plan view"). The side faces 5A and 5C extend along a first direction X, and face away from each other along a second direction Y, which intersects the first direction X. The side faces 5B and 5D extend along the second direction Y, and face away from each other along the first direction X. More specifically, the second direction Y is orthogonal to the first direction X.

In the semiconductor layer 2, an output region 6 and an input region 7 are defined. The output region 6 is defined in an area beside the side face 5C. The input region 7 is defined in an area beside the side face 5A. As seen in a plan view, the area SOUT of the output region 6 is equal to or larger than the area SIN of the input region 7 (SIN≤SOUT). The ratio SOUT/SIN of the area SOUT to the area SIN can be 1 or more but 10 or less (1<SOUT/SIN≤10). The ratio SOUT/SIN can be 1 or more but 2 or less, or 2 or more but 4 or less, or 4 or more but 6 or less, or 6 or more but 8 or less, or 8 or more but 10 or less. The input region 7 and the output region 6 can each have any planar shape, with no limitation to a particular shape. Needless to say, the ratio SOUT/SIN can be more than 0 but less than 1.

The output region 6 includes a power MISFET (metal-insulator-semiconductor field-effect transistor) 9 as one example of an insulated-gate power transistor. The power MISFET 9 has a gate, a drain, and a source.

The input region 7 includes a controller 10 as one example of a control circuit for controlling a power MISFET 9. The controller 10 includes a plurality of kinds of functional circuits that carry out various functions. The plurality of kinds of functional circuits include a circuit that generates a gate control signal SG for driving and controlling the power MISFET 9 according to an electrical signal fed in from the outside. The controller 10 along with the power MISFET 9 constitutes what is called an IPD (intelligent power device). IPDs are also known as IPMs (intelligent power modules).

The input region 7 is electrically insulated from the output region 6 by a region separation structure 8. In FIG. 1, the region separation structure 8 is indicated by hatching. While no specific description will be given of it, the region separation structure 8 can have a trench insulation structure with an insulator embedded in a trench.

On the semiconductor layer 2 are formed a plurality of (here, three) electrodes 11, 12, and 13. In FIG. 1, the plurality of electrodes 11 to 13 are indicated by hatching. The plurality of electrodes 11 to 13 are formed as terminal electrodes that are connected to the outside by leads (e.g., boding wires). There may be provided any number of electrodes 11 to 13 in any arrangement and with any planar shapes, with no limitation to how they appear in FIG. 1.

The number of electrodes 11 to 13 and their planar shapes and arrangement are adjusted according to the specifications of each of the power MISFET 9 and the controller 10. In the embodiment under discussion, the plurality of electrodes 11 to 13 include a drain electrode 11 (output electrode), a source electrode 12 (reference voltage electrode), and an input electrode 13.

The drain electrode 11 is formed on the second principal face 4 of the semiconductor layer 2. The drain electrode 11 delivers the electric signal generated by the power MISFET 9 to the outside.

The drain electrode 11 can include at least one of a Ti layer, a Ni layer, a Au layer, a Ag layer, and an Al layer. The drain electrode 11 can have a single-layer structure that includes a Ti layer, a Ni layer, a Au layer, a Ag layer, or an Al layer. The drain electrode 11 can have a stacked-layer structure in which at least two of a Ti layer, a Ni layer, a Au layer, a Ag layer, and an Al layer are stacked together in any manner.

The source electrode 12 is formed on the first principal face 3, over the output region 6. The source electrode 12 feeds a reference voltage (e.g., ground voltage) to the power MISFET 9 and to the various functional circuits in the controller 10.

The input electrode 13 is formed on the first principal face 3, over the input region 7. The input electrode 13 delivers an input voltage for driving the controller 10.

On the semiconductor layer 2 are also formed gate control conductors 17 as one example of a control conductor. The gate control conductors 17 are laid selectively in the output region 6 and the input region 7. The gate control conductors 17 are, in the output region 6, electrically connected to the gate of the power MISFET 9 and, in the input region 7, electrically connected to the controller 10.

The gate control conductors 17 delivers the gate control signal SG generated by the controller 10 to the gate of the power MISFET 9. The gate control signal SG includes an on signal Von and an off signal Voff, and controls the power MISFET 9 between an on and an off state.

The on signal Von is higher than the gate threshold voltage Vth of the power MISFET 9 (Vth<Von). The off signal Voff is lower than the gate threshold voltage Vth of the power MISFET 9 (Voff<Vth). The off signal Voff can be the reference voltage (e.g., ground voltage).

In the embodiment under discussion, the two gate control conductors 17 are laid in different regions. There may be provided any number of gate control conductors 17 in any arrangement and with any shapes and other features, which can be adjusted according to the transmission distance of the gate control signal SG, the bifurcation path of the gate control signal SG to be transmitted, and the like.

The source electrode 12, the input electrode 13, and the gate control conductors 17 can each contain at least one of nickel, palladium, aluminum, copper, an alloy of aluminum, and an alloy of copper.

The source electrode 12, the input electrode 13, and the gate control conductors 17 can each contain at least one of an Al—Si—Cu (aluminum-silicon-copper) alloy, an Al—Si (aluminum-silicon) alloy, and an Al—Cu (aluminum-copper) alloy.

The source electrode 12, the input electrode 13, and the gate control conductors 17 can all contain the same kind of electrode material, or may contain mutually different electrode materials.

Figure 2:
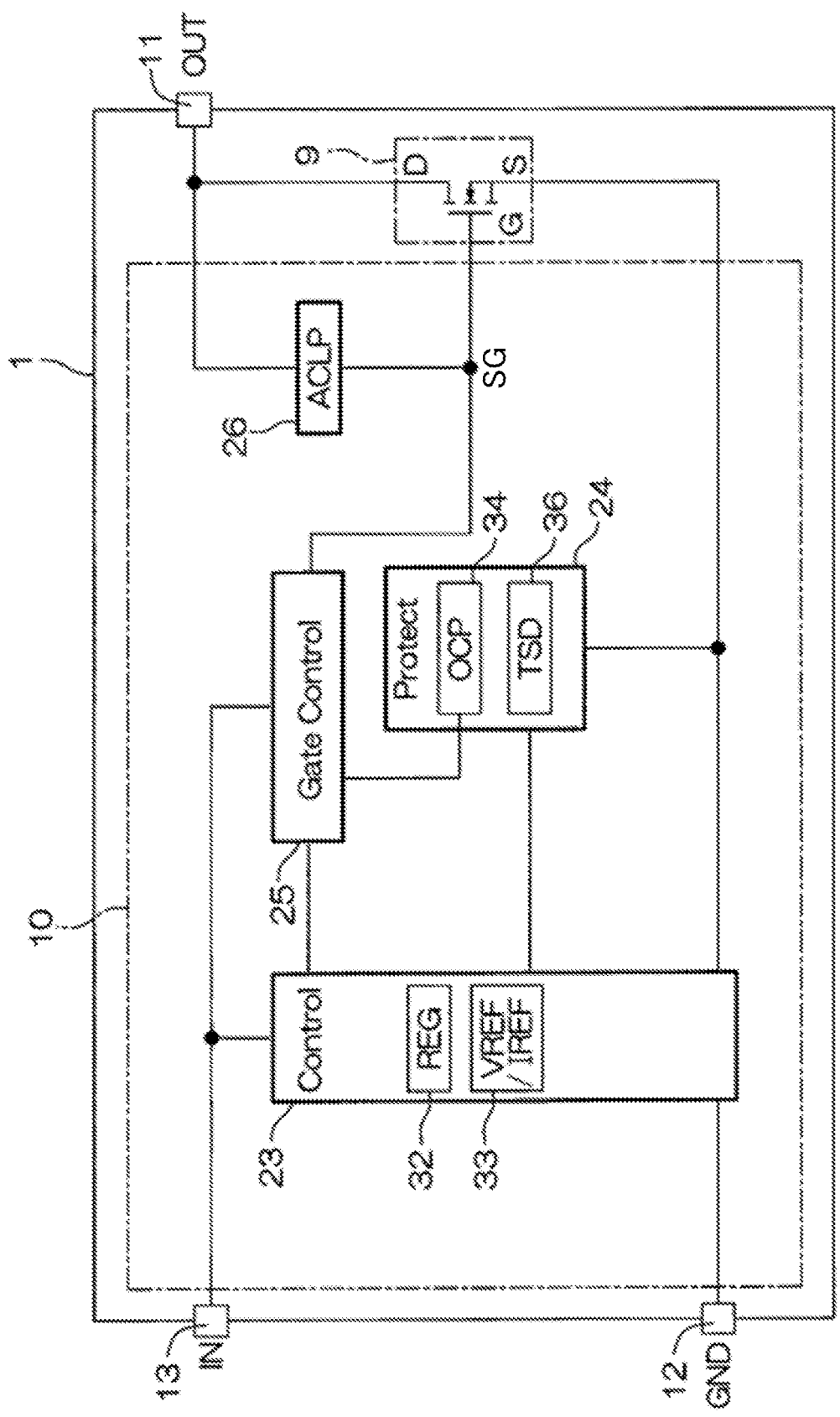
FIG. 2 is a block diagram showing the electrical structure of a semiconductor device.

FIG. 2 is a block circuit diagram showing the electrical structure of the semiconductor device 1 shown in FIG. 1. The following description deals with an example where the semiconductor device 1 is incorporated in a vehicle.

The semiconductor device 1 includes the drain electrode 11 as an output electrode, the source electrode 12 as a reference voltage electrode, the input electrode 13, the gate control conductors 17, the power MISFET 9, and the controller 10.

The drain electrode 11 is electrically connected to the drain of the power MISFET 9. The drain electrode 11 is connected to a load. The source electrode 12 is electrically connected to the source of the power MISFET 9. The source electrode 12 feeds a reference voltage (e.g., ground voltage GND) to the power MISFET 9 and to the controller 10.

The input electrode 13 can be connected to an MCU (microcontroller unit), a DC/DC converter, an LDO (low-dropout) regulator, or the like. The input electrode 13 feeds an input voltage to the controller 10. The input voltage fed to the input electrode 13 can be understood as an input signal IN for turning on and off the power MISFET 9. For example, the power MISFET 9 is on when the input signal IN is at high level, and is off when the input signal IN is at low level. The gate of the power MISFET 9 is connected via the gate control conductors 17 mentioned above to the controller 10 (in particular, a gate control circuit 25, which will be described later).

In the embodiment under discussion, the controller 10 incudes a current/voltage control circuit 23, a protection circuit 24, a gate control circuit 25, and an active clamp circuit 26.

The current/voltage control circuit 23 is connected to the source electrode 12, to the input electrode 13, to the protection circuit 24, and to the gate control circuit 25. The current/voltage control circuit 23 generates different currents and voltages based on electrical signals from the input electrode 13 and those from the current/voltage control circuit 23. In the embodiment under discussion, the current/voltage control circuit 23 includes a constant voltage generation circuit 32 and a reference voltage/reference current generation circuit 33.

The constant voltage generation circuit 32 generates a constant voltage VREG for driving the various circuits integrated in the semiconductor device 1. The constant voltage generation circuit 32 can include a Zener diode or a regulator circuit. The constant voltage VREG can be 1 V or higher but 5 V or lower. The constant voltage VREG is fed to, for example, the protection circuit 24.

The reference voltage/reference current generation circuit 33 generates a reference voltage VREF and a reference current IREF for the various circuits integrated in the semiconductor device 1. The reference voltage VREF can be 1 V or higher but 5 V or lower. The reference current IREF can be 1 mA or higher but 1 A or lower. The reference voltage VREF and the reference current IREF are fed to, for example, the protection circuit 24. In a case where the various circuits mentioned above include a comparator, the reference voltage VREF and the reference current IREF can be fed to that comparator.

The protection circuit 24 is connected to the current/voltage control circuit 23, to the gate control circuit 25, and to the source of the power MISFET 9. The protection circuit 24 includes an overcurrent protection circuit 34 and an overheat protection circuit 36.

The overcurrent protection circuit 34 protects the power MISFET 9 from an overcurrent. The overcurrent protection circuit 34 is connected to the gate control circuit 25. The overcurrent protection circuit 34 can include a current monitoring circuit. A signal generated by the overcurrent protection circuit 34 is fed to the gate control circuit 25.

The overheat protection circuit 36 protects the power MISFET 9 from an excessive rise in temperature. The overheat protection circuit 36 is connected to the current/voltage control circuit 23. The overheat protection circuit 36 monitors the temperature of the semiconductor device 1. The overheat protection circuit 36 can include a temperature sensing device such as a temperature-sensitive diode or thermistor. A signal generated by the overheat protection circuit 36 is fed to the current/voltage control circuit 23.

The gate control circuit 25 controls the power MISFET 9 between an on and an off state. The gate control circuit 25 is connected to the current/voltage control circuit 23, to the protection circuit 24, and to the gate of the power MISFET 9.

According to electrical signals from the current/voltage control circuit 23 and those from the protection circuit 24, the gate control circuit 25 generates the gate control signal SG for the power MISFET 9. The gate control signal SG is fed via the gate control conductors 17 to the gate of the power MISFET 9.

The active clamp circuit 26 protects the power MISFET 9 from a counter-electromotive force. The active clamp circuit 26 is connected to the drain electrode 11 and to the gate of the power MISFET 9. The active clamp circuit 26 can include a plurality of diodes.

The active clamp circuit 26 can include a plurality of diodes forward-bias-connected with respect to one another. The active clamp circuit 26 can include a plurality of diodes reverse-bias-connected with respect to one another. The active clamp circuit 26 can include a plurality of diodes forward-bias-connected with respect to one another and a plurality of diodes reverse-bias-connected with respect to one another.

The plurality of diodes can include pn-junction diodes, or Zener diodes, or pn-junction diodes and Zener diodes. The active clamp circuit 26 can include a plurality of Zener diodes bias-connected with respect to one another. The active clamp circuit 26 can include a Zener diode and a pn-junction diode reverse-bias-connected with respect to one another.

Figure 3:
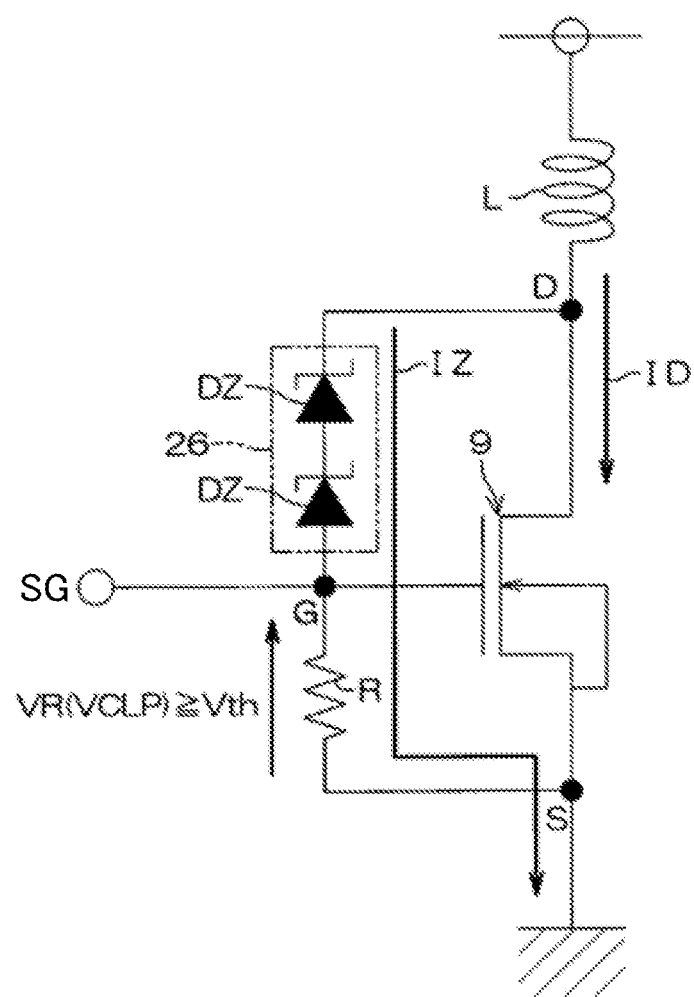
FIG. 3 is a diagram illustrating normal operation and active clamp operation of a semiconductor device.
Figure 4:
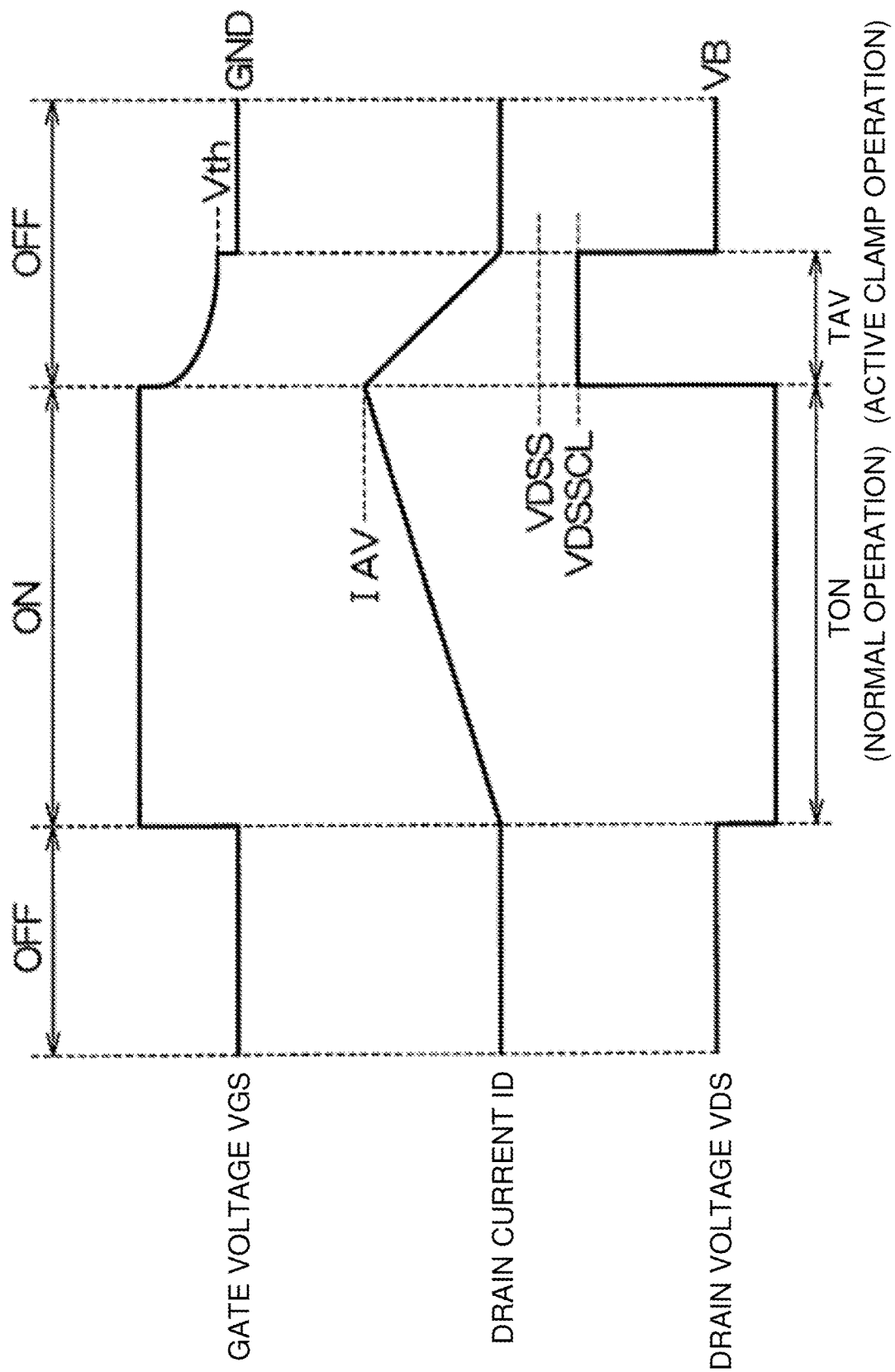
FIG. 4 is a waveform diagram of principal electrical signals.

FIG. 3 is a diagram illustrating the normal operation and the active clamp operation of the semiconductor device 1 shown in FIG. 1. FIG. 4 is a waveform diagram of principal electrical signals relevant to the circuit diagram of FIG. 3.

Here, the normal operation and the active clamp operation of the semiconductor device 1 will be described in terms of a circuit example where an inductive load L is connected to the drain of the power MISFET 9. The inductive load L can be a device that employs a winding (coil), such as a solenoid, a motor, a transformer, or a relay. An inductive load L is also called an L load.

Referring to FIG. 3, the source of the power MISFET 9 is connected to the ground. The drain of the power MISFET 9 is electrically connected to the inductive load L. The gate and the drain of the power MISFET 9 are connected to the active clamp circuit 26. The gate and the source of the power MISFET 9 are connected to a resistor R. In the circuit example under discussion, the active clamp circuit 26 includes k Zener diodes (where k is a natural number) bias-connected ed with respect to one another.

Referring to FIGS. 3 and 4, when the on signal Von is fed to the gate of the power MISFET 9, the power MISFET 9 turns from the off state to the on state (normal operation). The on signal Von has a voltage equal to or higher than the gate threshold voltage Vth (Vth≤Von). The power MISFET 9 is kept in the on state for a predetermined on period TON.

When the power MISFET 9 turns to the on state, a drain current ID starts to pass from the drain to the source of the power MISFET 9. The drain current ID increases in proportion to the on period TON of the power MISFET 9. As the drain current ID increase, the inductive load L accumulates inductive energy.

When the off signal Voff is fed to the gate of the power MISFET 9, the power MISFET 9 turns from the on state to the off state. The off signal Voff has a voltage lower than the gate threshold voltage Vth (Voff<Vth). The off signal Voff can have the reference voltage (e.g., ground voltage). When the power MISFET 9 turns to the off state, the inductive energy in the inductive load L is, as a counter-electromotive force, applied to the power MISFET 9.

As a result, the power MISFET 9 goes into an active clamp state (active clamp operation). When the power MISFET 9 goes into the active clamp state, its drain voltage VDS rises sharply up to a clamp voltage VDSSCL.

If the clamp voltage VDSSCL exceeds the rated maximum drain voltage VDSS (VDSS<VDSSCL), the power MISFET 9 breaks down. The power MISFET 9 is designed such that the clamp voltage VDSSCL is equal to or lower than the rated maximum drain voltage VDSS (VDSSCL≤VDSS).

If the clamp voltage VDSSCL is equal to or lower than the rated maximum drain voltage VDSS (VDSSCL≤VDSS), a reverse current IZ passes through the active clamp circuit 26. Thus, across the terminals of the active clamp circuit 26 appears a limit voltage VL. In the embodiment under discussion, the limit voltage VL is the sum of the terminal-to-terminal voltages VZ across the Zener diodes in the active clamp circuit 26 (VL=k·VZ).

The reverse current IZ passes through the resistor R to the ground. Thus, across the terminals of resistor R appears a terminal-to-terminal voltage VR. The terminal-to-terminal voltage VR (=IZ×R) across the resistor R is adjusted to be equal to or higher than the gate threshold voltage Vth (Vth≤VR). The terminal-to-terminal voltage VR is, as a clamp-on voltage VCLP, applied between the gate and the source of the power MISFET 9. Accordingly, the power MISFET 9 remains in the on state in the active clamp state. The clamp-on voltage VCLP (terminal-to-terminal voltage VR) can have a voltage lower than the on signal Von.

Thus, the inductive energy in the inductive load L is consumed (absorbed) by the power MISFET 9. During an active clamp period TAV, the drain current ID falls from its peak value IAV immediately before the turning-off of the power MISFET 9 down to zero. Now, the gate voltage VGS equals the ground voltage and the drain voltage VDS equals the supply voltage VB; thus, the power MISFET 9 turns from the on state to the off state.

<A Discussion on a Negative Current>

It is worth noting that, if the input electrode 13 has a negative potential for some reason, a negative current can pass out of the semiconductor device 1 toward the input electrode 13. It is therefore preferable to forestall such a negative current to protect an ECU (electronic control unit) or the like that is externally connected to the input electrode 13.

In particular, in cases where the semiconductor device 1 is expected to have a high current supply capacity (hence a low on-resistance), it is common to employ, as the device structure of the MISFET 9, a vertical structure where an N-type semiconductor substrate is used as the drain electrode 11 (output electrode). In such cases, as described previously, during the active clamp operation with an L load, the drain voltage VDS rises sharply up to the clamp voltage VDSSCL (several tens of volts), and thus a large negative current may pass from the N-type semiconductor substrate toward the input electrode 13.

A description now follows of a negative current prevention circuit that can prevent the occurrence of a negative current.

Negative Current Prevention Circuit (Comparative Example)

Figure 5:
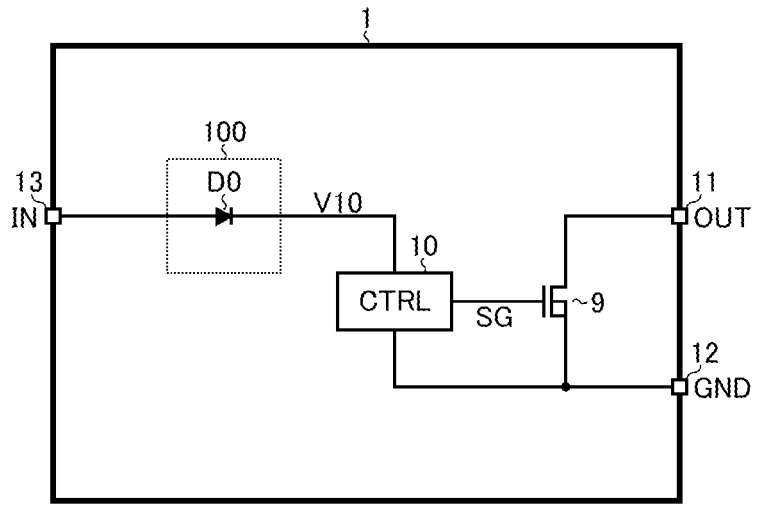
FIG. 5 is a diagram showing a comparative example of a negative current prevention circuit.

FIG. 5 shows a comparative example (a common configuration example for comparison with the embodiments described later) of a negative current prevention circuit to be implemented in the semiconductor device 1.

The negative current prevention circuit 100 of the comparative example includes a diode DO (such as a polysilicon diode). The anode of the diode DO is connected to the input electrode 13 for receiving the input signal IN. The cathode of the diode DO is connected to a power node of the controller 10 (i.e., an application terminal for an input voltage V10). The controller 10 is a kind of control circuit that generates the gate control signal SG for the power MISFET 9 in accordance with the input signal IN.

With the negative current prevention circuit 100 of this comparative example, when the input electrode 13 has a negative potential, the diode DO is reverse-biased. This prevents the occurrence of a negative current that passes toward the input electrode 13.

Inconveniently, with the negative current prevention circuit 100 of the comparative example, the input voltage V10 supplied from the input electrode 13 to the controller 10 in steady operation suffers a drop ascribable to the forward drop voltage Vf(D0) across the diode DO (i.e., V10=IN−Vf (D0)).

For example, in a case where the input voltage V10 is used as the high level of the gate control signal SG, the lower the input voltage V10, the higher the on-resistance of the power MISFET 9. For another example, in a case where the input voltage V10 is used as an internal suppl voltage, the internal circuits (such as a reference voltage source, an operational amplifier, a comparator, and the like) that operate by being supplied with the input voltage V10 has an accordingly narrower dynamic range.

Presented below will be a novel embodiment free from such inconveniences.

Negative Current Prevention Circuit (First Embodiment)

Figure 6:
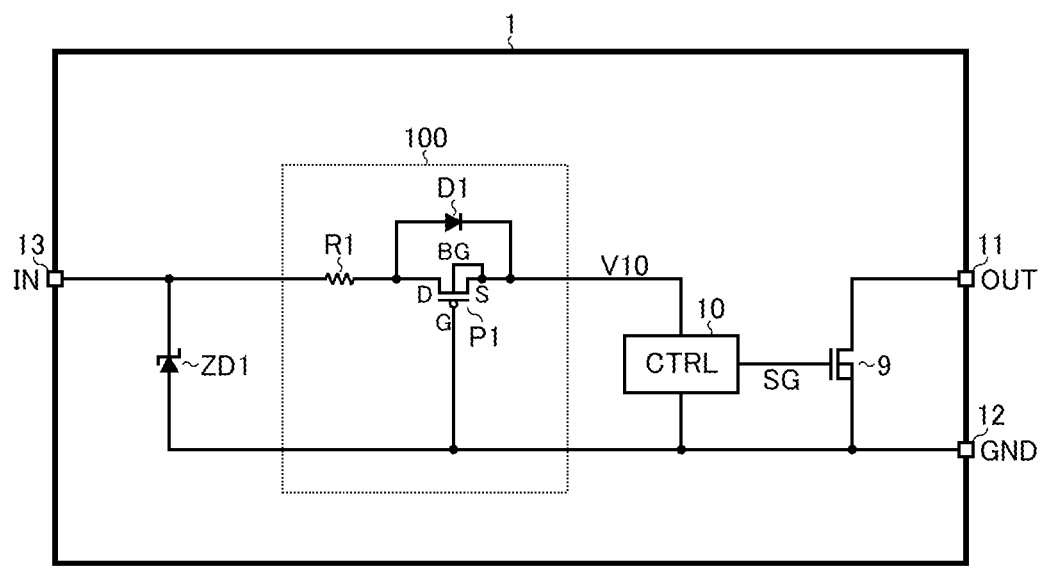
FIG. 6 is a diagram showing a negative current prevention circuit according to a first embodiment.

FIG. 6 is a diagram showing a negative current prevention circuit according to a first embodiment. The negative current prevention circuit 100 of the first embodiment is a circuit block that is provided between the input electrode 13 and the controller 10 to prevent a negative current from passing toward the input electrode 13, and includes a P-channel MISFET P1 (hereinafter abbreviated as "transistor P1"), a diode D1, and a resistor R1.

The first terminal of the resistor R1 is connected to the input electrode 13. The second terminal of the resistor R1 is connected to the drain of the transistor P1 and to the anode of the diode D1. The source and the back gate of the transistor P1 and the cathode of the diode D1 are all connected to the power node of the controller 10 (i.e., an application terminal for the input voltage V10). The gate of the transistor P1 is connected to the source electrode 12 (corresponding to a ground terminal).

As described above, the transistor P1 is connected between the input electrode 13 and the controller 10, with the drain toward the input electrode 13 and the source and the back gate both toward the controller 10. The diode D1 is connected between the input electrode 13 and the controller 10, with the anode toward the input electrode 13 and the cathode toward the controller 10. The gate of the transistor P1 is fed with a fixed potential (ground potential).

Also provided between the input electrode 13 and the controller 10 (in the diagram, upstream of the transistor P1 and the diode D1, closer to the input electrode 13) is the resistor R1, which functions as a current limiting resistor. Accordingly, if a negative current passing toward the input electrode 13 occurs, it can be limited so as not to be excessively high. To suppress the voltage drop across the terminals of the resistor R1 in steady operation, the resistor R1 can be given a resistance value of several hundred ohms to one kilohm.

The semiconductor device 1 further includes, between the input electrode 13 and the source electrode 12, a Zener diode ZD1, which functions as an electrostatic breakdown protection element. The cathode of the Zener diode ZD1 is connected to the input electrode 13. The anode of the Zener diode ZD1 is connected to the source electrode. With this configuration, even if an excessively high positive surge is applied to the input electrode 13, its intrusion can be clamped within the breakdown voltage of the Zener diode ZD1 as the upper limit. This helps prevent breakdown or the like of the semiconductor device 1.

<Device Structure of the Transistor P1>

Figure 7:
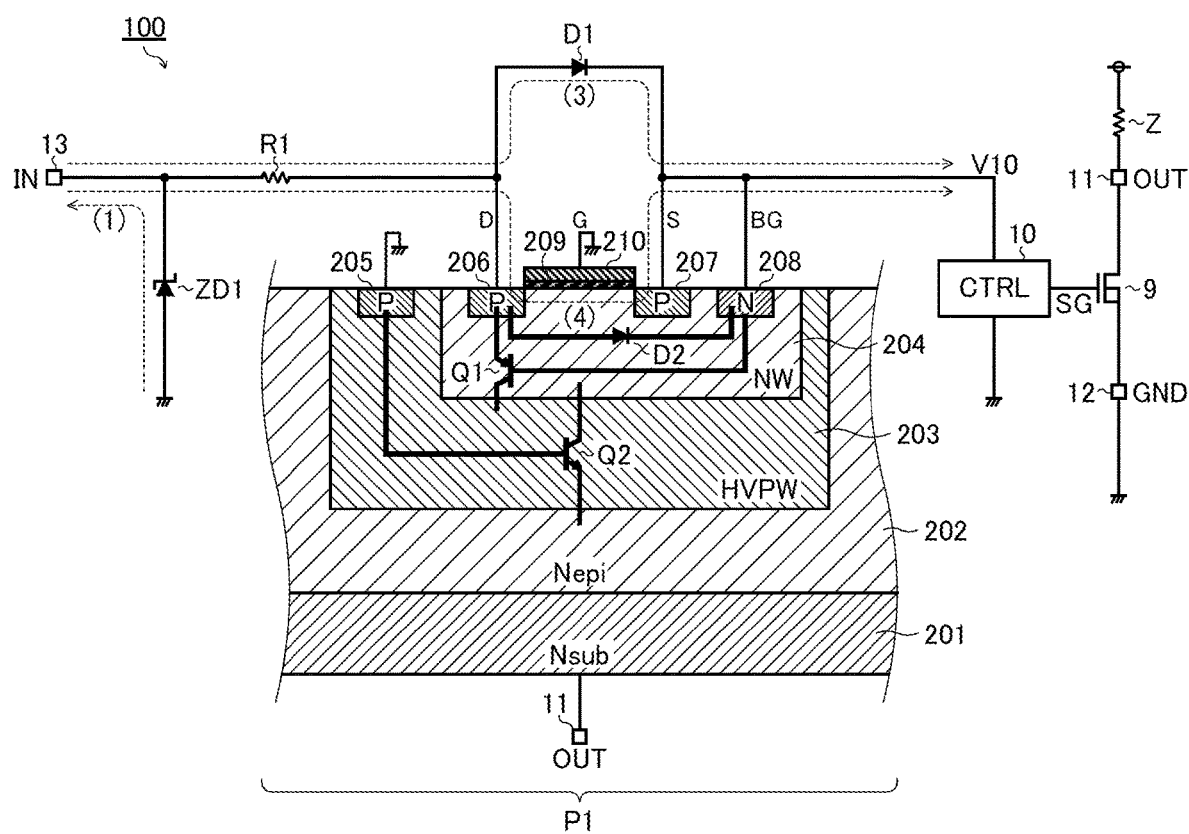
FIG. 7 is a diagram showing the device structure of a P-channel MISFET.

FIG. 7 is a diagram showing the device structure of the transistor P1. In a case where the device structure of the power MISFET 9 is implemented with a vertical structure where an N-type semiconductor substrate 201 is used as the drain electrode 11 (output electrode), the transistor P1 too is formed on the N-type semiconductor substrate 201.

Specifically, in terms of what is shown in the diagram, the transistor P1 includes the N-type semiconductor substrate 201, an N-type epitaxial layer 202, a high-withstand-voltage P-type well 203, an N-type well 204, a P-type contact region 205, a drain region 206, a source region 207, an N-type contact region 208, a gate insulation layer 209, and a gate metal layer 210.

As mentioned previously, the N-type semiconductor substrate 201 electrically conducts to the drain electrode 11 of the power MISFET 9.

The N-type epitaxial layer 202 is an N-type semiconductor region stacked over the entire surface of the N-type semiconductor substrate 201.

The high-withstand-voltage P-type well 203 is a P-type semiconductor region formed in the shape of a well in a part of the N-type epitaxial layer 202 from the surface down to a predetermined depth. The high-withstand-voltage P-type well 203 is connected via the P-type contact region 205 to a fixed potential terminal (e.g., ground terminal). Thus, the high-withstand-voltage P-type well 203 functions as a potential separation layer for separating between the potential at the N-type semiconductor substrate 201 and the N-type epitaxial layer 202 and the potential at the N-type well 204.

The N-type well 204 is an N-type semiconductor region formed in the shape of a well in a part of the high-withstand-voltage P-type well 203 from the surface down to a predetermined depth. The N-type well 204 corresponds to the back gate of the transistor P1, and is connected via the N-type contact region 208 to the power node of the controller 10 (i.e., the application terminal for the input voltage V10). Between the N-type well 204 and the N-type epitaxial layer 202 lies the high-withstand-voltage P-type well 203 mentioned previously. Thus, the potential at the back gate of the transistor P1 is separated from the potential at the N-type semiconductor substrate 201 and the N-type epitaxial layer 202.

The P-type contact region 205 is a high-doped P-type semiconductor region formed in the surface of the high-withstand-voltage P-type well 203, in an area outside where the N-type well 204 is formed. The P-type contact region 205 is connected to a fixed potential terminal (e.g., ground terminal).

The drain region 206 is a high-doped P-type semiconductor region formed in the surface of the N-type well 204. The drain region 206 corresponds to the drain of the transistor P1, and is along with the anode of the diode D1 connected via the resistor R1 to the input electrode 13.

The source region 207 is a high-doped P-type semiconductor region formed in the surface of the N-type well 204, a predetermined channel length apart from the drain region 206. The source region 207 corresponds to the source of the transistor P1, and is along with the cathode of the diode D1 connected to the power node of the controller 10 (i.e., the application terminal for the input voltage V10).

The N-type contact region 208 is a high-doped N-type semiconductor region formed in the surface of the N-type well 204. As mentioned previously, the N-type contact region 208 is connected to the power node of the controller 10 (i.e., the application terminal for the input voltage V10).

The gate insulation layer 209 is formed on the surface of a channel region that separates between the drain region 206 and the source region 207.

The gate metal layer 210 is formed on the surface of the gate insulation layer 209. The gate metal layer 210 corresponds to the gate of the transistor P1, and is connected to a fixed potential terminal (e.g., ground terminal).

Having the device structure described above, the transistor P1 is accompanied by a pnp-type parasitic transistor Q1 and an npn-type parasitic transistor Q2. The parasitic transistor Q1 has the drain region 206 as its emitter, the high-withstand-voltage P-type well 203 as its collector, and the N-type well 204 and the N-type contact region 208 as its base. The parasitic transistor Q2 has the N-type well 204 as its collector, the N-type epitaxial layer 202 as its emitter, and the high-withstand-voltage P-type well 203 and the P-type contact region 205 as its base. These parasitic transistors Q1 and Q2 constitute a pnpn-type parasitic thyristor.

The transistor P1 is accompanied also by a body diode D2. As mentioned previously, the back gate of the transistor P1 is short-circuited not to the drain region 206 at the input electrode 13 side but to the source region 207 at the controller 10 side. That is, while with a common P-channel MISFET its back gate is short-circuited to a high-potential node (in terms of what is shown in the diagram, the drain region 206), with the transistor P1 its back gate is connected to a low-potential node (in terms of what is shown in the diagram, the source region 207). Accordingly, the body diode D2 is, with the drain region 206 as its anode and the N-type well 204 and the N-type contact region 208 as its cathode, parasitic to the transistor P1.

Example of Operation

Figure 8:
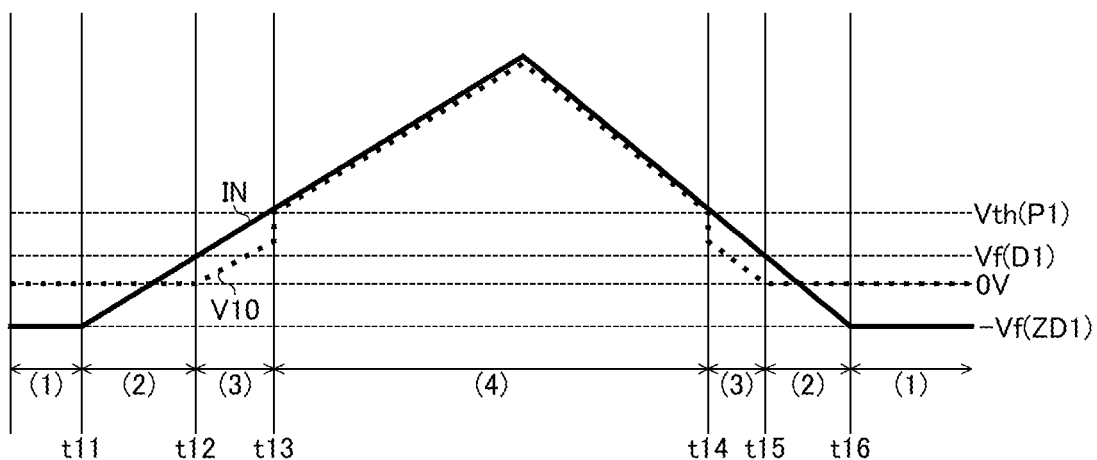
FIG. 8 is a diagram showing an example of the operation of a negative current prevention circuit.

FIG. 8 is a diagram showing one example of the operation of the negative current prevention circuit 100. In the diagram, a solid line represents the input signal IN applied to the input electrode 13, and a broken line represents the input voltage V10 applied to the power node of the controller 10. The diagram shows how, with the passage of time running from left to right, the input signal IN rises from a negative potential to a positive potential and then back from the positive potential to the negative potential.

The following description assumes that the on threshold voltage of the transistor P1 is Vth(P1), that the on threshold voltage of the parasitic transistor Q1 (hence the on threshold voltage of the parasitic thyristor) is Vth(Q1), that the drain-source voltage of the transistor P1 is Vds(P1), that the forward drop voltage of the diode D1 is Vf(D1), and the forward drop voltage of the Zener diode ZD1 is Vf(ZD1).

It is also assumed that the forward drop voltage Vf(D1) of the diode D1 is lower than either of the respective on threshold voltages Vth(P1) and Vth(Q1) of the transistor P1 and the parasitic transistor Q1. It is further assumed that the drain-source voltage Vds(P1) of the transistor P1 is significantly lower than the forward drop voltage Vf(D1) of the diode D1.

In period (1) (before time point t11 and after time point t16), IN≤−Vf(ZD1). During this period, in the negative current prevention circuit 100, the transistor P1 is off and the diode D1 and the body diode D2 are both reverse-biased. Thus, no negative current passes from the controller 10 toward the input electrode 13. The source and the back gate of the transistor P1 (i.e., the application terminal for the input voltage V10) are pulled down to the ground potential (0 V) (see the resistor R2 in FIG. 11). Incidentally, in period (1), a negative current passes across a current path leading from the ground terminal via the Zener diode ZD1 toward the input electrode 13 (see the broken-line arrow (1) in FIG. 7); this however does not pose a serious problem.

In period (2) (between time points t11 and t12 and between time points t15 and t16), −Vf(ZD1)<IN≤Vf(D1). During this period, as during period (1), in the negative current prevention circuit 100, the transistor P1 is off and the diode D1 and the body diode D2 are both reverse-biased. Thus, no negative current passes from the controller 10 toward the input electrode 13. Also, as during period (1), the source and the back gate of the transistor P1 are pulled down to the ground potential (0 V). In period (2), the Zener diode ZD1 too is reverse-biased, and thus no negative current passes via the Zener diode ZD1 either.

In period (3) (between time points t12 and t13 and between time points t14 and t15), Vf(D1)<IN≤Vth(P1). During this period, in the negative current prevention circuit 100, while the transistor P1 remains off, the diode D1 is forward-biased, and thus a positive current passes across a current path leading from the input electrode 13 via the diode D1 toward the controller 10 (see the broken-line arrow (3) in FIG. 8). As a result, the input voltage V10 has a value (=IN−Vf(D1)) that is lower than the input signal IN by the forward drop voltage across the diode D1.

In period (4) (between time points t13 and t14), Vth(P1) <IN. During this period, in the negative current prevention circuit 100, the transistor P1 is on, and thus a positive current passes across a current path leading from the input electrode 13 via the transistor P1 toward the controller 10 (see the broken-line arrow (4) in FIG. 7). As a result, the input voltage V10 has a value (=IN−Vds(P1)) lower than the input signal IN by the drain-source voltage Vds(P1) of the transistor P1. Generally, the diode D1 has a forward drop voltage Vf(D1) of several hundred millivolts (about 0.6 to 0.7 V). By contrast, the transistor P1 has a drain-source voltage Vds (P1) of several tens of millivolts (about 0.02 to 0.07 V). This helps greatly reduce the voltage drop across the negative current prevention circuit 100, making it possible to supply the controller 10 with, as the input voltage V10, the input signal IN almost as it is.

<Function of the Diode D1>

Next, the reason that the diode D1 is connected in parallel with the diode D1 will be described briefly. As mentioned previously, the transistor P1 is accompanied by a pnpn-type parasitic thyristor (i.e., the parasitic transistors Q1 and Q2). Thus, if, when a high-level input signal IN is fed in, the input voltage V10 is kept pulled down until the transistor P1 turns on, a potential difference equal to or larger than the on threshold voltage Vth(Q1) occurs between the base and the emitter of the parasitic transistor Q1, and this may turn the parasitic thyristor on.

By contrast, with the diode D1 connected in parallel with the transistor P1, the potential difference between the base and the emitter of the parasitic transistor Q1 can be clamped at the forward drop voltage Vf across the diode D1. Thus, setting the forward drop voltage Vf(D1) across the diode D1 at a voltage value lower than the on threshold voltage Vth(Q1) of the parasitic transistor Q1 prevents the parasitic thyristor from turning on.

<Voltage Drop Across the Resistor R1>

Next, the voltage drop across the resistor R1 will be described briefly. As mentioned previously, to suppress the voltage drop across the resistor R1 in steady operation, it is preferable to give the resistor R1, which functions as a current limiting resistor, a resistance value of several hundred ohms to one kilohm. Consider, for example, a case where the resistor R1 is 1 kΩ and the circuit current that passes from the input electrode 13 via the resistor R1 to the controller 10 is 80 µA. In this case, the voltage drop across the resistor R1 is about 80 mV and adding the drain-source voltage Vds(P1) of the transistor P1 to it amounts to about 100 mV at most. By contrast, in the comparative example, the forward drop voltage across the diode D0 is several hundred millivolts (about 0.6 to 0.7 V) and thus, even with the resistor R1 inserted, it is possible to reduce the voltage drop across the negative current prevention circuit 100 satisfactorily.

<A Study on a Latch-Up>

As mentioned a few times earlier, the transistor P1 is accompanied by a pnpn-type parasitic thyristor. Thus, if the voltage applied to the N-type semiconductor substrate 201, that is, the output voltage OUT applied to the drain electrode 11 (i.e., the drain voltage VDS of the power MISFET 9), is at so low a potential (e.g., ground potential, negative potential, or open-state potential) as to be equal to or lower than a latch-up recovery voltage Vrec, which will be described later, the parasitic thyristor may turn on and cause a latch-up. Now, with reference to the relevant drawings, a description will be given of the results of a study on a latch-up.

Figure 9:
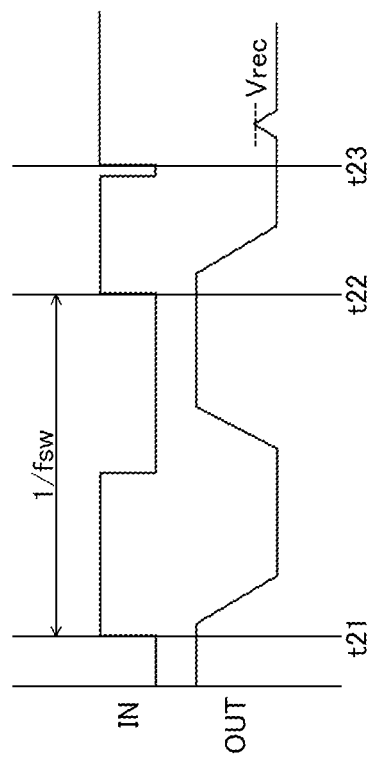
FIG. 9 is a diagram showing the results of a study on a latch-up.

FIG. 9 is a diagram showing the results of a study on a latch-up, depicting, from top down, the input signal IN and the output voltage OUT.

As depicted at time points t21 and t22, at normal start-up of the semiconductor device 1, while the output voltage OUT is at high level (≈the load supply voltage), the input signal IN rises from low level to high level. In this case, the parasitic thyristor of the transistor P1 does not turn on, causing no latch-up.

Now, consider a case where, as depicted at time point t23, after normal start-up of the semiconductor device 1, in response to a negative surge or the like the input signal IN momentarily falls to low level. In this case, while the output voltage OUT has fallen to the ground potential (0 V), the input signal IN rises from low level to high level. Thus, the parasitic thyristor of the transistor P1 may turn on, causing a latch-up.

Particularly worth noting is that, through a close study, the present inventors have found out that if, while the output voltage OUT is at so low a potential as to be equal to or lower than the latch-up recovery voltage Vrec (e.g., 3.8 V), the input signal IN rises from low level to high level, the parasitic thyristor of the transistor P1 turns on and causes a latch-up.

If a latch-up as described above occurs, the semiconductor device 1 does not operate normally, leading to a state where the power MISFET 9 does not turn on fully, in other words, a state where the on-resistance of the power MISFET 9 is raised compared with in normal operation. In this state, however, the output voltage OUT starts to rise until, when OUT>Vrec, the latch-up is eliminated and the semiconductor device 1 recovers automatically.

In view of the above results of the study, it is preferable that the maximum driving frequency fsw_max (i.e., the maximum value of the driving frequency fsw) of the input signal IN be set at a value such that, after the input signal IN turns from high level (the logic level corresponding to the on-period) to low level (the logic level corresponding to the off-period), the input signal IN does not turn from low level back to high level before the drain voltage of the power MISFET 9 (i.e., the output voltage OUT) becomes at least higher than the latch-up recovery voltage Vrec.

For example, the maximum driving frequency fsw_max of the input signal IN can be set at ten to several tens of kilohertz (e.g., 18 kHz). Under such driving conditions, the output voltage OUT becomes higher than the latch-up recovery voltage Vrec during the period after the input signal IN is dropped to low level before it is raised to high level in the next cycle. It is thus possible to start up the semiconductor device 1 properly without causing a latch-up as described above.

Negative Current Prevention Circuit (Second Embodiment)

Figure 10:
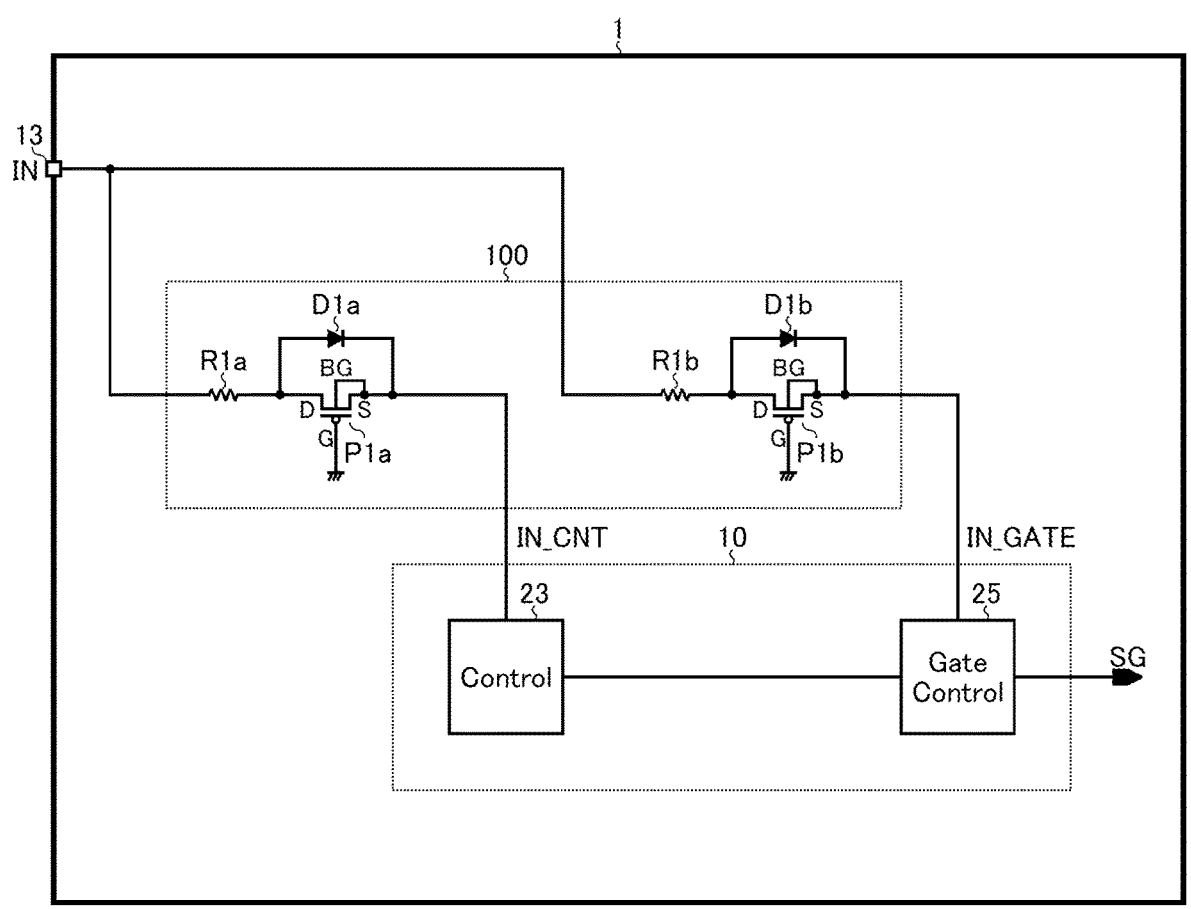
FIG. 10 is a diagram showing a negative current prevention circuit according to a second embodiment.

FIG. 10 is a diagram showing a negative current prevention circuit according to a second embodiment. The negative current prevention circuit 100 of the second embodiment is based on that of the first embodiment (FIG. 6) described previously but differs from it in including P-channel MISFETs P1a and P1b (hereinafter abbreviated as "transistors P1a and P1b" respectively), diodes D1a and D1b, and resistors Ria and Rib, one of each between the input electrode 13 and the current/voltage control circuit 23 and one of each between the input electrode 13 and the gate control circuit 25.

The first terminal of the resistor Ria is connected to the input electrode 13. The second terminal of the resistor Ria is connected to the drain of the transistor P1a and to the anode of the diode D1a. The source and the back gate of the transistor P1a and the cathode of the diode D1a are all connected to the power node of the current/voltage control circuit 23 (i.e., an application terminal for an input voltage IN_CNT). The gate of the transistor P1a is connected to the source electrode 12 (corresponding to a ground terminal).

The first terminal of the resistor R1b is connected to the input electrode 13. The second terminal of the resistor R1b is connected to the drain of the transistor P1b and to the anode of the diode D1b. The source and the back gate of the transistor P1b and the cathode of the diode D1b are all connected to the power node of the gate control circuit 25 (i.e., an application terminal for an input voltage IN_GATE). The gate of the transistor P1b is connected to the source electrode 12 (corresponding to the ground terminal).

The ratio of the channel width W to the channel length L (what is called W/L) in the transistor P1a can be designed to be about 100 μm/1.2 μm. The resistor R1a can be designed to be about 800Ω. The voltage drop across the transistor P1a (i.e., the drain-source voltage in the transistor P1a in the on state) can be designed to be about 0.07 V.

This design helps reduce the voltage drop in the input voltage IN_CNT, which corresponds to the internal supply voltage for the current/voltage control circuit 23. This helps avoid reducing the operating dynamic range of the internal circuits (a reference voltage source, an operational amplifier, a comparator, and the like) constituting the current/voltage control circuit 23, and enables it to operate by being supplied with a lower input signal IN. In other words, a microcomputer that can operate at a lower voltage (e.g., one that operates at 3.3 V) can then be used as the source of the supply of the input signal IN.

On the other hand, the W/L of the transistor P1b can be designed to be about 10 μm/1.2 μm. The resistor R1b can be designed to be about 1 kΩ. The voltage drop across the transistor P1b (i.e., the drain-source voltage in the transistor P1b in the on state) can be designed to be about 0.02 V.

This design helps reduce the voltage drop in the input voltage IN_GATE, which corresponds to the internal supply voltage for the gate control circuit 25. This makes it possible, for example in a case where the input voltage IN_GATE is used as the high level of the gate control signal SG, to reduce the on-resistance of the power MISFET 9 as the input voltage IN_GATE is higher, and thus to suppress loss (heat generation) during high-power output.

<Notes on Circuit Designing>

Figure 11:
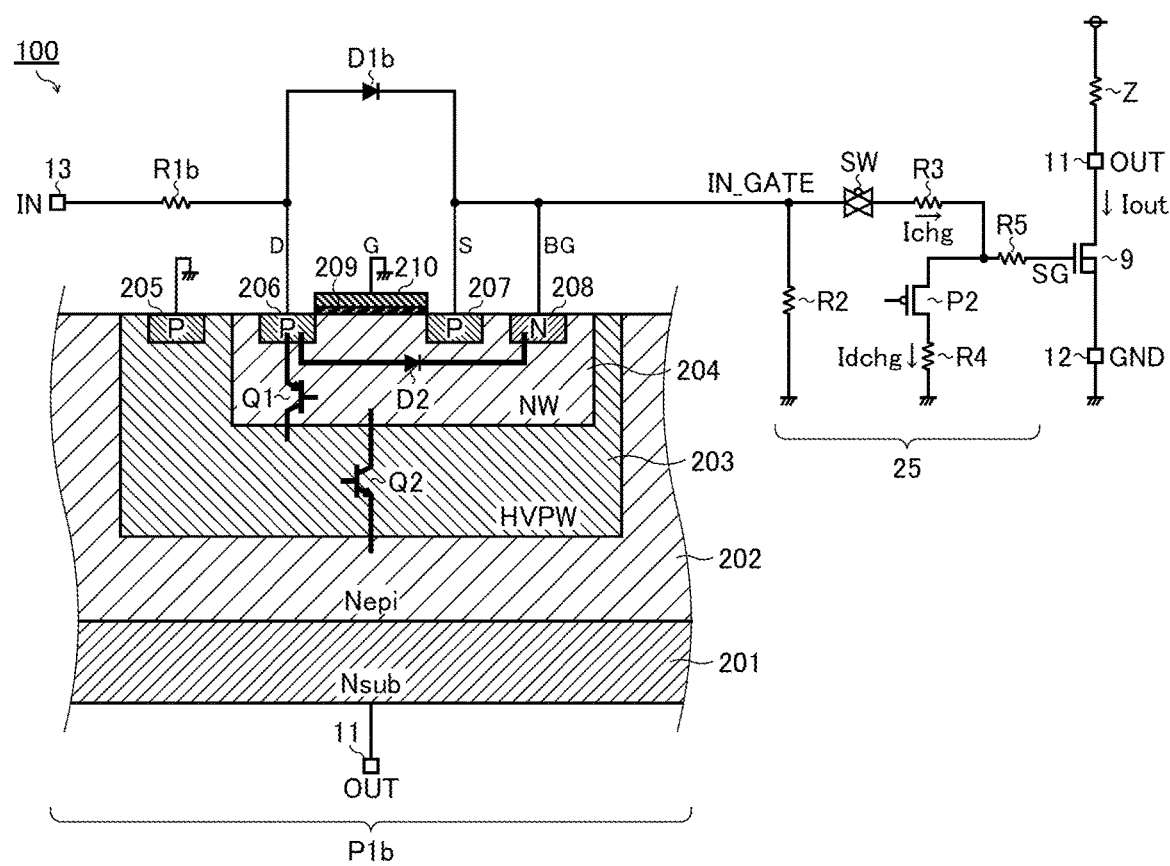
FIG. 11 is a diagram showing an example of connection of a gate control circuit.

FIG. 11 is a diagram showing an example of how the gate control circuit 25 is connected. The gate control circuit 25 of this configuration example includes, as circuit elements that constitute an output stage for the gate control signal SG, a P-channel MISFET P2 (hereinafter abbreviated as "transistor P2"), resistors R2 to R5, and an analog switch SW.

The first terminals of the analog switch SW and the resistor R2 are both connected to the output terminal of the negative current prevention circuit 100 (i.e., an application terminal for the input voltage IN_GATE). The second terminal of the analog switch SW is connected to the first terminal of the resistor R3. The second terminal of the resistor R3 and the source of the transistor P2 are both connected to the first terminal of the resistor R5. The second terminal of the resistor R5 is, as an output terminal for the gate control signal SG, connected to the gate of the power MISFET 9. The drain of the transistor P2 is connected to the first terminal of the resistor R4. The second terminals of the resistors R2 and R4 are both connected to the ground terminal (i.e., the source electrode 12).

The negative current prevention circuit 100 here is basically similar to that of the first embodiment described previously except that the transistor P1, the diode D1, and the resistor R1 in FIG. 7 are here replaced with the transistor P1b, the diode D1b, and the resistor R1b.

In the gate control circuit 25 of this configuration example, if the input signal IN is at high level, the analog switch SW is on and the transistor P2 is off. Thus, a charge current Ichg passes from the input electrode 13 via the negative current prevention circuit 100, the analog switch SW, and the resistors R3 and R5 toward the gate of the power MISFET 9. As a result, an unillustrated gate capacitance is charged; thus the gate control signal SG rises the high level and the power MISFET 9 turns on. Now, through the power MISFET 9 passes an output current Iout.

By contrast, if the input signal IN is at low level, the analog switch SW is off and the transistor P2 is on. Thus, a discharge current Idchg passes from the gate of the MISFET 9 via the resistor R5, the transistor P2, and the resistor R4 toward the ground terminal. As a result, the unillustrated gate capacitance is discharged; thus the gate control signal SG falls to low level and the power MISFET 9 turns off. Now, the input voltage IN_GATE is pulled down via the resistor R2.

Figure 12:
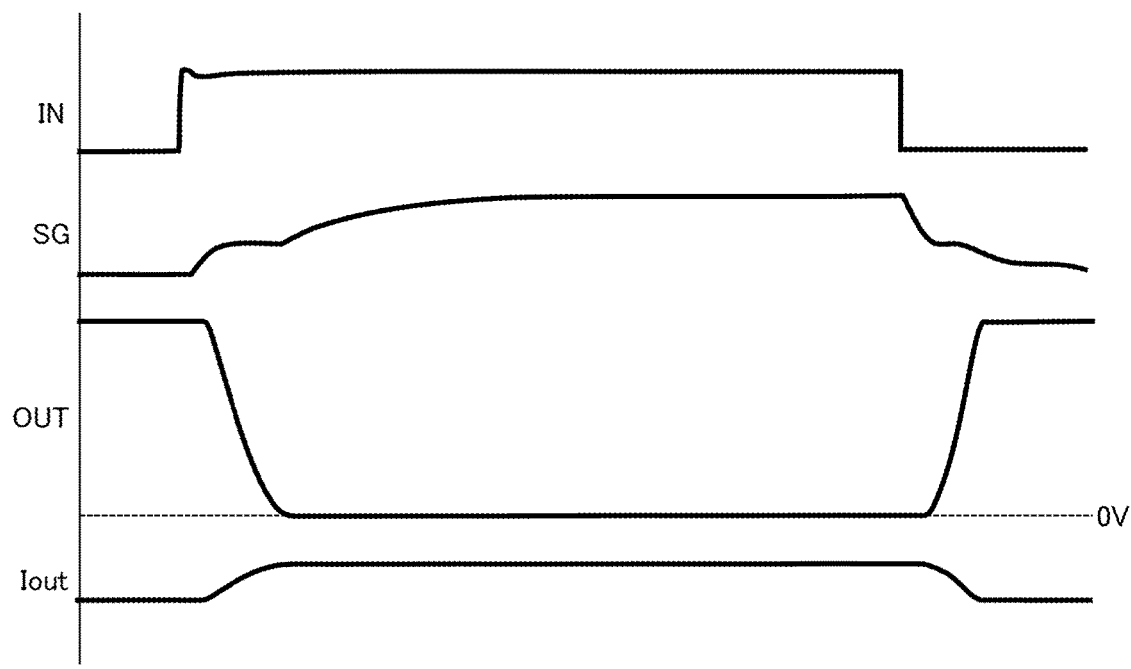
FIG. 12 is a diagram showing an example of operation at normal start-up.

FIG. 12 is a diagram showing an example of the operation of the semiconductor device 1 observed when it starts up normally (e.g., Ta=160° C., IN=5 V), depicting, from top down, the input signal IN, the gate control signal SG, the output voltage OUT, and the output current Iout.

As shown in the diagram, when the semiconductor device 1 starts up normally, in response to the input signal IN rising to high level, the gate control signal SG rises to high level, the power MISFET 9 turns fully on, and the output current Iout passes. Now, the output voltage OUT falls to close to the ground potential (0 V).

Figure 13:
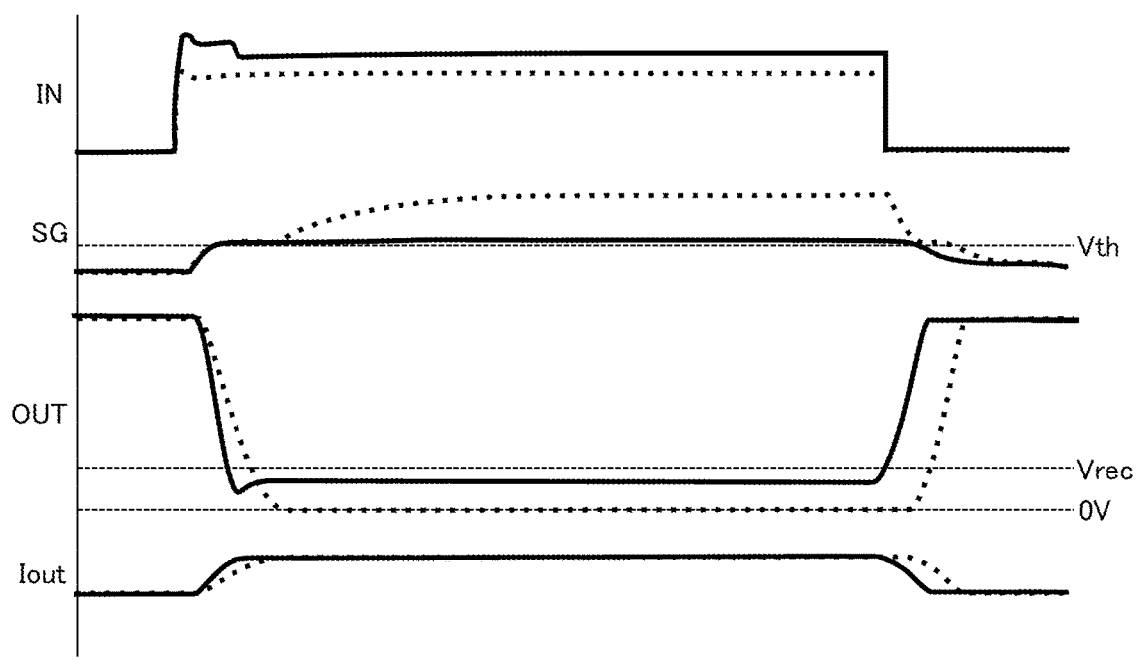
FIG. 13 is a diagram showing an example of operation at abnormal start-up.

FIG. 13 is a diagram showing an example of the operation of the semiconductor device 1 observed when it starts up abnormally (e.g., Ta=160° C., IN=7.5 V), depicting, like FIG. 12 referred to previously, from top down, the input signal IN, the gate control signal SG, the output voltage OUT, and the output current Iout. The broken lines in the diagram indicate the behavior during normal start-up (i.e., the behavior shown in FIG. 12).

As shown in the diagram, if due to high temperature the high level potential of the input signal IN becomes higher, the gate control signal SG does not fully rise to its supposed high level and stagnates around the gate threshold voltage Vth of the power MISFET 9 (SG≥Vth). As a result, while the output current Iout passes, the power MISFET 9 does not turn fully on. The cause is presumed to be a latch-up during the charging of the gate capacitance.

More specifically, when immediately after the start-up of the semiconductor device 1 the gate capacitance is charged, a charge current Ichg (on the order of milliamperes) far higher than the circuit current (several tens of microamperes) during steady operation passes transiently through the transistor P1b. Meanwhile, when the drain-source voltage Vds(P1b) of the transistor P1b becomes higher than the forward drop voltage Vf(D2) of the body diode D2, the parasitic transistor Q1 can turn on.

Moreover, as mentioned previously, the gate control signal SG becomes higher than the gate threshold voltage Vth of the power MISFET 9; thus the power MISFET 9 turns on and the output voltage OUT falls. As a result, at the timing that the output voltage OUT becomes lower than the latch-up recovery voltage Vrec mentioned earlier, the parasitic thyristor that accompanies the transistor P1b turns on and causes a latch-up.

The latch-up described above during the start-up of the semiconductor device 1 can be effectively prevented by, with respect to the transistor P1b, which is arranged in the current path through which the charge current Ichg passes, (1) arranging the resistor R3 in the stage preceding the transistor P1b or (2) increasing the channel width W of the transistor P1b.

Figure 14:
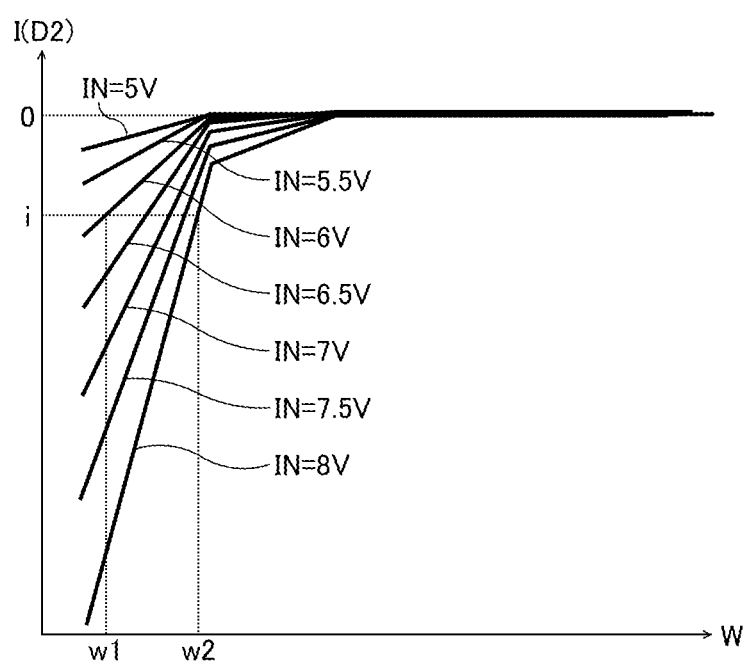
FIG. 14 is a diagram showing the relationship between channel width and body current.

FIG. 14 is a diagram showing the relationship between the channel width W of the transistor P1b and the body current I(D2) through the body diode D2. The diagram depicts, in particular, the behavior observed in each of cases where IN=5 V, 5.5 V, 6 V, 6.5 V, 7 V, 7.5 V, and 8 V.

In the diagram, the polarity of the body current I(D2), whether it is positive or negative, is defined assuming that the direction of the charge current Ichg (i.e., the direction toward the gate of the power MISFET 9) is negative. That is, the diagram reveals that, as the channel width W of the transistor P1b increases, the current value of the body current I(D2) through the body diode D2 decreases.

For example, consider a case where it has been confirmed that, if the current value of the body current I(D2) is smaller than a predetermined threshold value i (e.g., 35 µA), no latch-up will occur when the semiconductor device 1 starts up. In this case, if the maximum value of the input signal IN (i.e., the maximum voltage value that can be applied as the high level of the input signal IN) is 6 V, all that needs to be done is to design the channel width W such that W≥w1 (e.g., about 10 µA). For another example, if the maximum value of the input signal IN is 8 V, the channel width W can be designed such that W≥w2 (e.g., about 18 µA).

As described above, for the transistor P1b provided between the input electrode 13 and the gate control circuit 25, it is preferable to do device designing such that it has a channel width W that suits the maximum value of the input signal IN.

On the other hand, the transistor P1a provided between the input electrode 13 and the current/voltage control circuit 23 has no risk of being exposed to an excessive rush current at the start-up of the semiconductor device 1. It thus does not require device designing with consideration given to measures against a latch-up at start-up.

<Application to a Vehicle>

Figure 15:
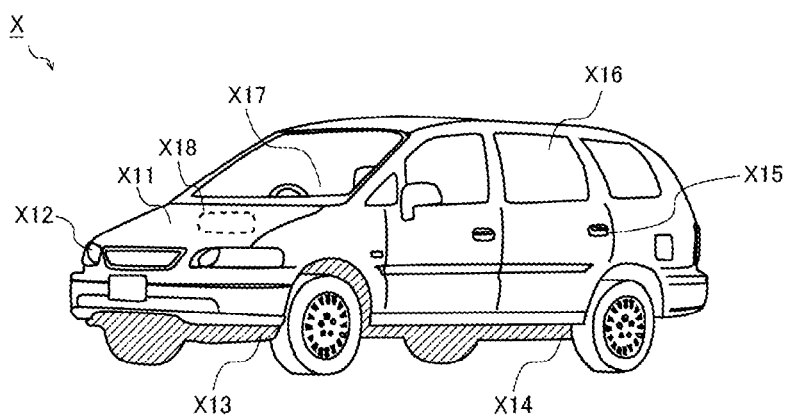
FIG. 15 is an exterior view showing one configuration example of a vehicle.

FIG. 15 is an exterior view showing one configuration example of a vehicle. The vehicle X of this configuration example incorporates a battery (not shown in the diagram) and various electronic devices X11 to X18 that operate by being supplied with electric power from the battery.

The vehicle X can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

For the sake of convenience, in the diagram, the electronic devices X11 to X18 may be shown at places different from where they are actually arranged.

The electronic device X11 is an electronic control unit that performs control with respect to an engine (injection control, electronic throttle control, idling control, oxygen sensor heater control, automatic cruise control, etc.) or control with respect to a motor (torque control, power regeneration control, etc.).

The electronic device X12 is a lamp control unit that controls the lighting and extinguishing of HIDs (high-intensity discharged lamps), DRLs (daytime running lamps), or the like.

The electronic device X13 is a transmission control unit that performs control with respect to a transmission.

The electronic device X14 is a body control unit that performs control with respect to the movement of the vehicle X (ABS [anti-lock brake system] control, EPS [electric power steering] control, electronic suspension control, and the like).

The electronic device X15 is a security control unit that drives and controls door locks, burglar alarms, and the like.

The electronic device X16 comprises electronic devices incorporated in the vehicle X as standard or manufacturer-fitted equipment at the stage of factory shipment, such as wipers, power side mirrors, power windows, dampers (shock absorbers), a power sun roof, and power seats.

The electronic device X17 comprises electronic devices fitted to the vehicle X optionally as user-fitted equipment, such as A/V (audio/visual) equipment, a car navigation system, and an ETC (electronic toll control system).

The electronic device X18 comprises electronic devices provided with high-withstand-voltage motors, such as a vehicle-mounted blower, an oil pump, a water pump, and a battery cooling fan.

The semiconductor device 1 (i.e., low-side switch LSI) described previously can be built into any of the electronic devices X11 to X18.

<Overview>

To follow is an overview of the various embodiments described herein.

For example, according to one aspect of what is disclosed herein, a switching device includes: an N-type semiconductor substrate; a power MISFET configured to have the N-type semiconductor substrate as its drain; an input electrode configured to receive an input signal; a control circuit configured to generate a gate control signal for the power MISFET according to the input signal; and a negative current prevention circuit configured to be provided between the input electrode and the control circuit to prevent a negative current from passing toward the input electrode. The negative current prevention circuit includes: a P-channel MISFET configured to be connected, with its drain toward the input electrode and its source and back gate both toward the control circuit, between the input electrode and the control circuit, the gate of the P-channel MISFET being fed with a fixed potential, the potential at the back gate of the P-channel MISFET being separated from the potential of the N-type semiconductor substrate; and a diode configured to be connected, with its anode toward the input electrode and its cathode toward the control circuit, between the input electrode and the control circuit. (A first configuration.)

In the switching device of the first configuration described above, the forward drop voltage across the diode may be lower than the n threshold voltage of a parasitic transistor that accompanies the P-channel MISFET. (A second configuration.)

In the switching device of the first or second configuration described above, the maximum driving frequency of the input signal may be set at such a value that the input signal, after turning from the logic level corresponding to the on period to the logic level corresponding to the off period, does not turn from the logic level corresponding to the off period back to the logic level corresponding to the on period until the drain voltage of the power MISFET becomes at least higher than a latch-up recovery voltage. (A third configuration.)

In the switching device of any of the first to third configurations described above, the control circuit may include: a current/voltage control circuit configured to generate various currents and voltages as electrical signals corresponding to the input signal; and a gate control circuit configured to generate the gate control signal according to the electrical signals from the current/voltage control circuit. (A fourth configuration.)

In the switching device of the fourth configuration described above, the negative current prevention circuit may include the P-channel MISFET and the diode one of each between the input electrode and the current/voltage control circuit and one of each between the input electrode and the gate control circuit. (A fifth configuration.)

In the switching device of the fifth configuration described above, the P-channel MISFET provided between the input electrode and the gate control circuit may have a channel width corresponding to the maximum value of the input signal. (A sixth configuration.)

In the switching device of any of the first to sixth configurations described above, the negative current prevention circuit may further include a resistor configured to be provided between the input electrode and the control circuit to limit the negative current. (A seventh configuration.)

The switching device of any of the first to seventh configurations described above may further include an electrostatic breakdown protection element configured to be connected between the input electrode and a ground terminal. (An eighth configuration.)

For example, according to another aspect of what is disclosed herein, an electronic appliance includes: the switching device of any of the first to eighth configurations described above; and a load connected to the switching device. (A ninth configuration.)

For example, according to yet another aspect of what is disclosed herein, a vehicle includes the electronic appliance of the ninth configuration described above. (A tenth configuration.)

According to the invention disclosed herein, it is possible to provide a switching device that can prevent the occurrence of a negative current, and to provide an electronic appliance and a vehicle that employ such a switching device.

<Further Modifications>

While the embodiment described above deals with a low-side switch LSI for vehicle onboard use, this is not meant to limit the scope of application of the negative current prevention circuit disclosed herein, which can be applied to any low-side switch LSIs other than those for vehicle onboard use.

The various technical features disclosed herein may be implemented in any manners other than as in the embodiments described above, and allow for many modifications without departure from the spirit of their technical ingenuity. That is, the embodiments described above should be understood to be in every aspect illustrative and not restrictive, and the technical scope of the present invention is defined not by the description of the embodiments given above but by the appended claims and encompasses any modifications within a scope equivalent in significance to what is claimed.

The invention claimed is:

1. A switching device, comprising:
   an N-type semiconductor substrate;
   a power MISFET configured to have the N-type semiconductor substrate as a drain thereof;
   an input electrode configured to receive an input signal;
   a control circuit configured to generate a gate control signal for the power MISFET according to the input signal; and
   a negative current prevention circuit configured to be provided between the input electrode and the control circuit to prevent a negative current from passing toward the input electrode,
   wherein
   the negative current prevention circuit includes:
      a P-channel MISFET configured to be connected, with a drain thereof toward the input electrode and a source and a back gate thereof both toward the control circuit, between the input electrode and the control circuit, a gate of the P-channel MISFET being fed with a fixed potential, a potential at the back gate of the P-channel MISFET being separated from a potential of the N-type semiconductor substrate; and
      a diode configured to be connected, with an anode thereof toward the input electrode and a cathode thereof toward the control circuit, between the input electrode and the control circuit.

2. The switching device according to claim 1, wherein a forward drop voltage across the diode is lower than an on threshold voltage of a parasitic transistor that accompanies the P-channel MISFET.

3. The switching device according to claim 1, wherein a maximum driving frequency of the input signal is set at such a value that the input signal, after turning from a logic level corresponding to an on period to a logic level corresponding to an off period, does not turn from the logic level corresponding to the off period back to the logic level corresponding to the on period until a drain voltage of the power MISFET becomes at least higher than a latch-up recovery voltage.

4. The switching device according to claim 1, wherein the control circuit includes:
   a current/voltage control circuit configured to generate various currents and voltages as electrical signals corresponding to the input signal; and
   a gate control circuit configured to generate the gate control signal according to the electrical signals from the current/voltage control circuit.

5. The switching device according to claim 4, wherein the negative current prevention circuit includes the P-channel MISFET and the diode
   one of each between the input electrode and the current/voltage control circuit and
   one of each between the input electrode and the gate control circuit.

6. The switching device according to claim 5, wherein the P-channel MISFET provided between the input electrode and the gate control circuit has a channel width corresponding to a maximum value of the input signal.

7. The switching device according to claim 1, wherein the negative current prevention circuit further includes a resistor configured to be provided between the input electrode and the control circuit to limit the negative current.

8. The switching device according to claim 1, further comprising an electrostatic breakdown protection element configured to be connected between the input electrode and a ground terminal.

9. An electronic appliance, comprising:
   the switching device according to claim 1; and
   a load connected to the switching device.

10. A vehicle, comprising the electronic appliance according to claim 9.

* * * * *